United States Patent
Purtell et al.

(10) Patent No.: US 8,658,500 B2
(45) Date of Patent: Feb. 25, 2014

(54) SINGLE CRYSTAL U-MOS GATES USING MICROWAVE CRYSTAL REGROWTH

(75) Inventors: Robert J. Purtell, West Jordan, UT (US); Steve Sapp, Felton, CA (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/543,033

(22) Filed: Jul. 6, 2012

(65) Prior Publication Data

US 2013/0023096 A1 Jan. 24, 2013

Related U.S. Application Data

(60) Provisional application No. 61/506,303, filed on Jul. 11, 2011.

(51) Int. Cl.
 *H01L 21/336* (2006.01)
(52) U.S. Cl.
 USPC .. 438/270; 257/66; 257/E21.33; 257/E21.41; 438/482; 438/589
(58) Field of Classification Search
 USPC ......... 257/66, E21.33, E21.41; 438/270, 482, 438/589
 See application file for complete search history.

(56) References Cited

U.S. PATENT DOCUMENTS

| | | | | |
|---|---|---|---|---|
| 6,110,278 | A * | 8/2000 | Saxena | 117/95 |
| 6,518,113 | B1 * | 2/2003 | Buynoski | 438/217 |
| 8,415,671 | B2 * | 4/2013 | Zhang | 257/66 |
| 2007/0020892 | A1 * | 1/2007 | Kim | 438/479 |

OTHER PUBLICATIONS

Purtell, U.S. Appl. No. 13/168,270, filed Jun. 24, 2011.*

* cited by examiner

*Primary Examiner* — John C Ingham
(74) *Attorney, Agent, or Firm* — Kenneth E. Horton; Kirton McConkie

(57) ABSTRACT

Semiconductor devices and methods for making such devices are described. The UMOS semiconductor devices contain single-crystal gates that have been re-grown or formed at low temperature using microwaves. The devices can be formed by providing a semiconductor substrate, forming a trench in the substrate, forming an insulating layer in the trench, depositing a pre-gate layer on the insulating layer, the pre-gate layer comprising a conductive and/or semiconductive material (Si or SiGe) with a non-single crystal structure, contacting the pre-gate layer with a seed layer with a single-crystal structure, and heating the pre-gate layer using microwaves at low temperatures to recrystallize the non-single crystal structure into a single-crystal structure. These processes can improve the resistance and mobility of the gate either as a single crystal structure, optionally with a silicide contact above the source-well junction, enabling a higher switching speed UMOS device. Other embodiments are described.

20 Claims, 4 Drawing Sheets

SINGLE CRYSTAL U-MOS GATES USING MICROWAVE CRYSTAL REGROWTH

CROSS-REFERENCE TO RELATED APPLICATION

This application claims priority of U.S. Provisional Application Ser. No. 61/506,303 filed Jul. 11, 2011, the entire disclosure of which is incorporated herein by reference.

FIELD

This application relates generally to semiconductor devices and methods for making such devices. More specifically, this application describes UMOS (U-shaped MOSFET) semiconductor devices containing single-crystal gates that have been re-grown using microwaves with low temperature processing.

BACKGROUND

Semiconductor devices containing integrated circuits (ICs) or discrete devices are used in a wide variety of electronic apparatus. The IC devices (or chips or discrete devices) comprise a miniaturized electronic circuit that has been manufactured in the surface of a substrate of semiconductor material. The circuits are composed of many overlapping layers, including layers containing dopants that can be diffused into the substrate (called diffusion layers) or ions that are implanted (implant layers) into the substrate. Other layers are conductors (polysilicon or metal layers) or connections between the conducting layers (via or contact layers). IC devices or discrete devices can be fabricated in a layer-by-layer process that uses a combination of many steps, including growing layers, imaging, deposition, etching, doping and cleaning. Silicon wafers are typically used as the substrate and photolithography is used to mark different areas of the substrate to be doped or to deposit and define polysilicon, insulators, or metal layers.

One type of semiconductor device, a metal oxide silicon field effect transistor (MOSFET) device, can be widely used in numerous electronic apparatus, including automotive electronics, disk drives and power supplies. Some MOSFET devices can be formed in a trench that has been created in the substrate. One feature making the trench configuration attractive is that the current flows vertically through the channel of the MOSFET. This permits a higher cell and/or current channel densities than other MOSFETs where the current flows horizontally through the channel and then vertically through the drain. The trench MOSFET devices contain a gate structure formed in the trench where the gate structure contains a gate insulating layer on the sidewall and bottom of the trench (i.e., adjacent the substrate material) with a conductive layer that has been formed on the gate insulating layer.

SUMMARY

This application describes semiconductor devices and methods for making such devices. The UMOS semiconductor devices contain single-crystal gates that have been re-grown or formed at low temperature using microwaves. The UMOS semiconductor devices can be formed by providing a semiconductor substrate, forming a trench in the substrate, forming an insulating layer in the trench, depositing a pre-gate layer on the insulating layer, the pre-gate layer comprising a conductive and/or semiconductive material (Si or SiGe) with a non-single crystal structure, contacting the pre-gate layer with a seed layer with a single-crystal structure, and heating the pre-gate layer using microwaves at low temperatures to recrystallize the non-single crystal structure into a single-crystal structure. These processes can improve the resistance and mobility of the gate either as a single crystal structure or a single crystal structure with a silicide contact above the source-well junction, enabling a higher switching speed UMOS device.

BRIEF DESCRIPTION OF THE DRAWINGS

The following description can be better understood in light of the Figures, in which.

Figure 1:
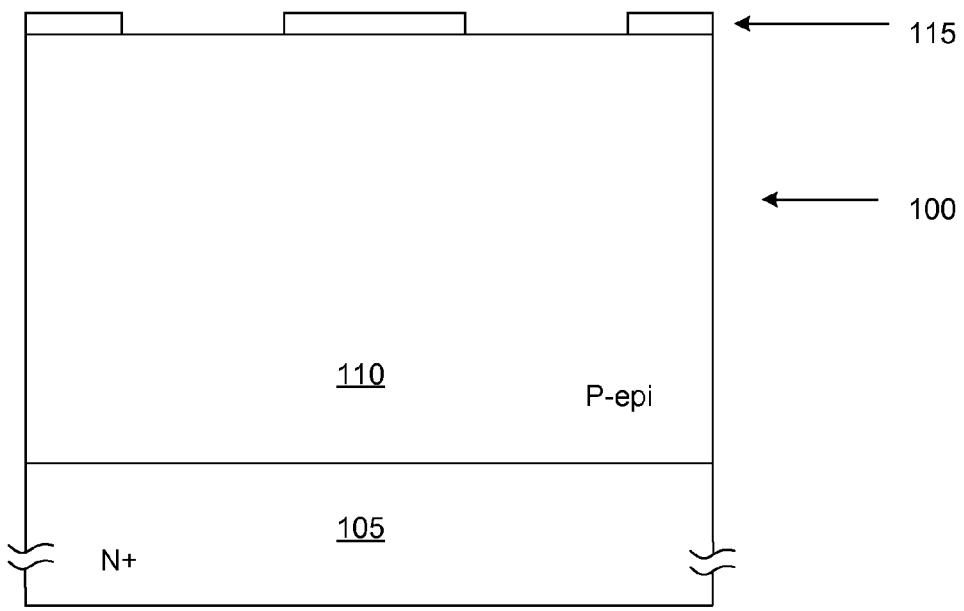
FIG. 1 shows some embodiments of methods for making a semiconductor structure containing a substrate and an epitaxial (or "epi") layer with a mask on the upper surface of the epitaxial layer.

The Figures illustrate specific aspects of the semiconductor devices and methods for making such devices. Together with the following description, the Figures demonstrate and explain the principles of the methods and structures produced through these methods. In the drawings, the thickness of layers and regions are exaggerated for clarity. The same reference numerals in different drawings represent the same element, and thus their descriptions will not be repeated. As the terms on, attached to, or coupled to are used herein, one object (e.g., a material, a layer, a substrate, etc.) can be on, attached to, or coupled to another object regardless of whether the one object is directly on, attached, or coupled to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

DETAILED DESCRIPTION

The following description supplies specific details in order to provide a thorough understanding. Nevertheless, the skilled artisan would understand that the semiconductor devices and associated methods of making and using the devices can be implemented and used without employing these specific details. Indeed, the semiconductor devices and associated methods can be placed into practice by modifying the illustrated devices and methods and can be used in conjunction with any other apparatus and techniques conventionally used in the industry. For example, while the description refers to U-MOS (U-shaped MOSFET) semiconductor devices, it could be modified for any other types of semiconductor devices which may or may not contain gate structures formed in a trench, such as LDMOS or CMOS devices.

Some embodiments of the semiconductor devices and methods for making such devices are illustrated in the Figures and described herein. In these embodiments, the methods can begin as depicted in FIG. 1 when a semiconductor substrate 105 is first provided as part of the semiconductor structure 100. Any semiconductor substrate known in the art can be used as the substrate 105. Examples of some substrates include single-crystal silicon wafers, epitaxial Si layers, and/or bonded wafers such as used in silicon-on-insulator (SOI) technologies. Also, any other semiconducting material typically used for electronic devices can be used as the material for the substrate 105 under the right conditions, including Ge, SiGe, GaN, C, and/or any pure or compound semiconductors, such as III-V or II-VIs and their variants. Any or all of these substrates may remain undoped or be doped with any number of p-type or n-type dopant or combination of dopants. In some configurations, the substrate 105 comprises a single-crystal Si wafer which is heavily doped with any type or number of n-type dopants to the desired concentration. In other configurations, the substrate 105 contains a single-crystal epitaxial layer on part or its entire upper surface.

The semiconductor structure 100 can optionally contain one or more epitaxial (or "epi") layers located on a portion of the upper surface of the substrate 105. In FIG. 1, the individual epitaxial layer (or multiple epitaxial layers) are depicted as epitaxial layer 110. In some configurations, the epitaxial layer 110 covers substantially the entire upper surface of substrate 105. Where Si is used as the material for the substrate 105, the epitaxial layer 110 comprises Si. The epitaxial layer(s) 110 can be provided using any process in the art, including any epitaxial deposition process. In some instances, the epitaxial layer(s) can be lightly doped with any type of number of p-type dopants, as shown in FIG. 1.

Figure 2:
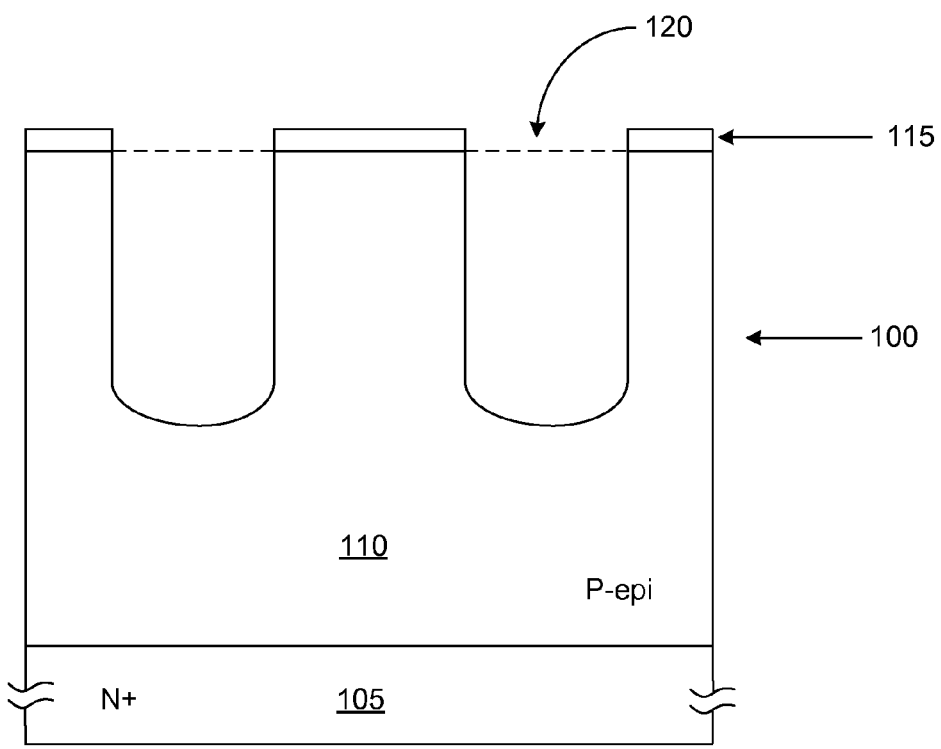
FIG. 2 depicts some embodiments of methods for making a semiconductor structure containing a trench formed in the epitaxial layer.

Next, as shown in FIG. 2, a trench 120 can be formed in the epitaxial layer 110 (and optionally in the substrate 105). The trench 120 can be formed by any known process, including using a mask 115 formed on the upper surface of the epitaxial layer 110, as shown in FIG. 1. The trench 120 is then created by etching the material of the epitaxial layer 110 (and, if desired, the substrate 105) using any etchant. In some embodiments, the epitaxial layer 110 can be etched until the trench 120 has reached the desired depth and width in the epitaxial layer 110.

The depth and width of the trench 120, as well as the ratio of the width to the depth (the aspect ratio), can be controlled so that so a later-deposited insulating layer properly fills in the trench and minimizes the formation of voids. In some embodiments, the depth of the trench can range from about 0.1 to about 100 μm. In other embodiments, the depth of the trench can range from about 2 to about 5 μm. In yet other embodiments, the depth of the trench can be any suitable combination or sub-range of these amounts.

In some embodiments, the width of the trench can range from about 0.1 to about 50 μm. In other embodiments, the width of the trench can range from about 0.1 to about 1 μm. In yet other embodiments, the depth of the trench can be any suitable combination or sub-range of these amounts.

With such depths and widths in the trench, the aspect ratio of the trench can range from about 1:1 to about 1:50. In other embodiments, the aspect ratio of the trench can range from about 1:5 to about 1:8.3. In yet other embodiments, the aspect ratio of the trench can be any suitable combination or sub-range of these amounts.

Figure 3:
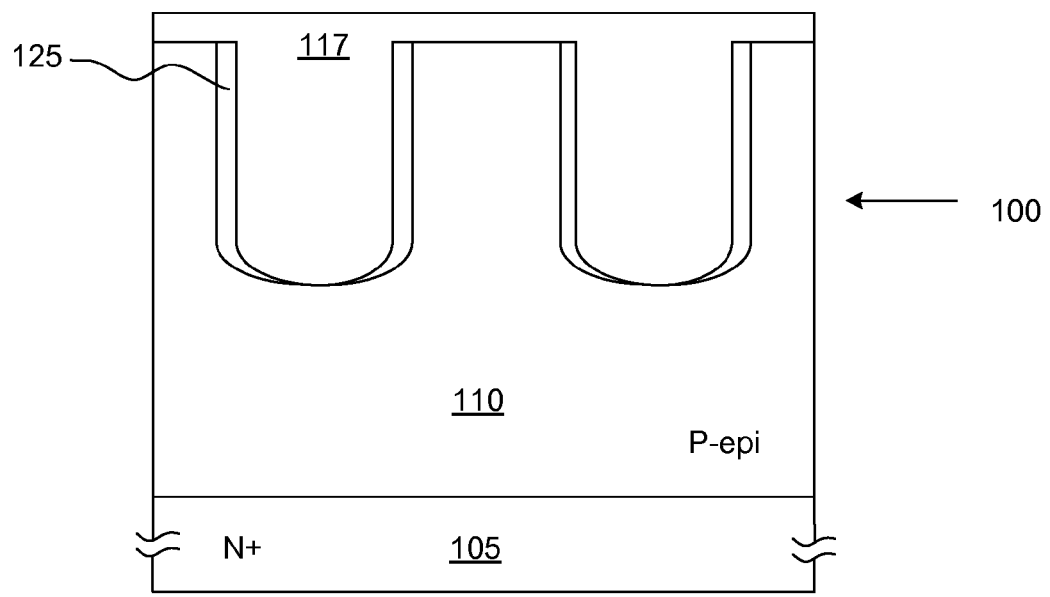
FIG. 3 depicts some embodiments of methods for making a semiconductor structure containing a gate insulating layer in the trench.

After the trench has been created, the mask 115 can be removed from the resulting structure. Then, as shown in FIG. 3, a gate insulating layer 125 can then be formed on the sidewall and bottom of the trenches 120. The gate insulating layer can be any dielectric material used in semiconductor devices. Examples of these dielectric materials include silicon oxide, silicon nitride, silicon oxynitride, hafnium oxide, (HfO2), and combinations thereof. In some embodiments, the gate insulating layer 125 can be made of a high quality silicon oxide material (or gate oxide).

The gate insulating layer 125 can be formed by any process that creates a layer on the sidewall and bottom of the trenches 120. In some embodiments, the gate insulating layer 125 can be formed by depositing the desired dielectric material until it overflows the trenches 120. During this deposition, the thickness of the deposited dielectric material can be adjusted to any desired thickness. The dielectric material can be deposited using any known deposition process which can form a highly conformal step coverage within the trench. Examples of such deposition processes include chemical vapor deposition (CVD) processes, such as SACVD (sub-atmospheric CVD) or high density plasma oxide (HDP), or atomic layer deposition (ALD) processes. If needed, a reflow process can be used to reflow the deposited dielectric material, helping reduce voids or defects within the dielectric material. After the dielectric material has been deposited to the desired thickness, an etch back process can be used to remove the excess insulating material and form the gate insulating layer 125, as shown in FIG. 2.

In the embodiments where the gate insulating later 125 comprises a gate oxide layer, the gate oxide layer 125 can also be formed by oxidizing the epitaxial layer 110 in an oxide-containing atmosphere until the desired thickness of the oxide layer has been grown in the sidewall and bottom of the trench 120. In these embodiments, the oxidation process can be performed until the thickness of the gate oxide layer 125 can range from about 60 Å to about 500 Å.

Then, as shown in FIG. 3, a pre-gate layer 117 can be deposited on the gate insulating layer 125 in the trench 120. The pre-gate layer 117 can comprise any conductive and/or semiconductive material with a non-single crystal structure, including amorphous Si (a-Si), polysilicon, GaN, amorphous C (a-C), carbon-containing precursors, or SiGe. In some embodiments, the pre-gate layer comprises a-Si or SiGe.

The pre-gate layer 117 can be deposited by any deposition process, including chemical vapor deposition processes (e.g., CVD, PECVD, or LPCVD) or sputtering processes using the desired material of the pre-gate layer 117 as the sputtering target. In the embodiments where the pre-gate layer 117 contains Si materials, the pre-gate layer 117 can be deposited using Si-containing gases, such as silane, di-silane, tri-silane, di-chlorosilane, germane, or combinations thereof. The pre-gate layer 117 can be deposited so that it fills and overflows over the upper part of the trench 120, as shown in FIG. 3.

In some configurations, the pre-gate layer 117 can be doped with any desired dopant material either during or after the deposition. In some embodiments, the pre-gate layer 117 can be doped with P- and/or B-containing dopant materials. In these embodiments, the concentration of the P and/or B dopants in the pre-gate layer can range from about $1 \times 10^{18}$ atoms/cm$^3$ to about $3 \times 10^{20}$ atoms/cm$^3$. In other embodiments, the concentration of the P and/or B dopants in the pre-gate layer can range from about $1 \times 10^{19}$ atoms/cm$^3$ to about $2\times10^{20}$ atoms/cm$^3$. In still other embodiments, the concentration can be any suitable combination or sub-range of these amounts.

The P and/or B dopants can be incorporated into to the pre-gate layer 117 using any known process that will obtain the concentrations described herein. In some embodiments, such as where silane gas is used to form the pre-gate layer, a P- and/or B-containing gas can be added to the silane gas. The P- and/or B-containing gas(es) that can be used include diborane, $PH_3$, $BCL_3$, or combinations thereof. In some other embodiments, the P and/or B dopants can be implanted after the pre-gate layer 117 has been formed.

Figure 4A:
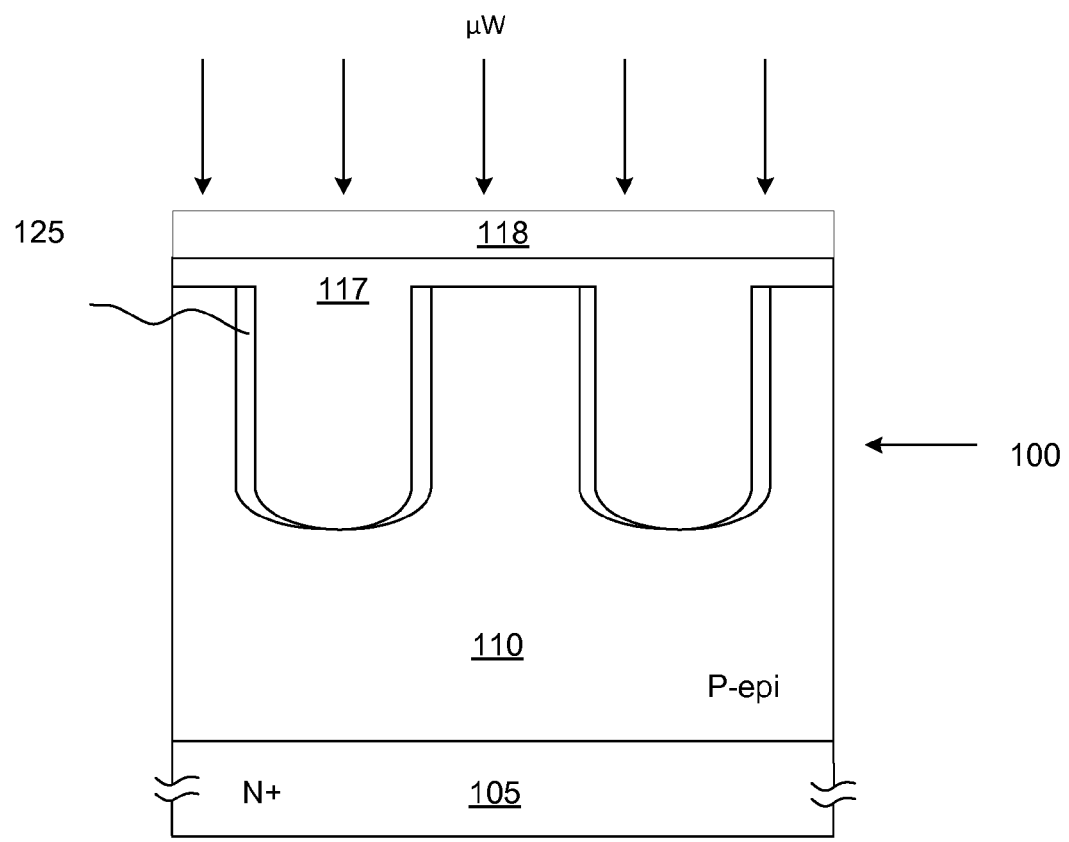
FIGS. 4A and 4B show some embodiments of methods for making a semiconductor structure containing a seed layer.
Figure 4B:
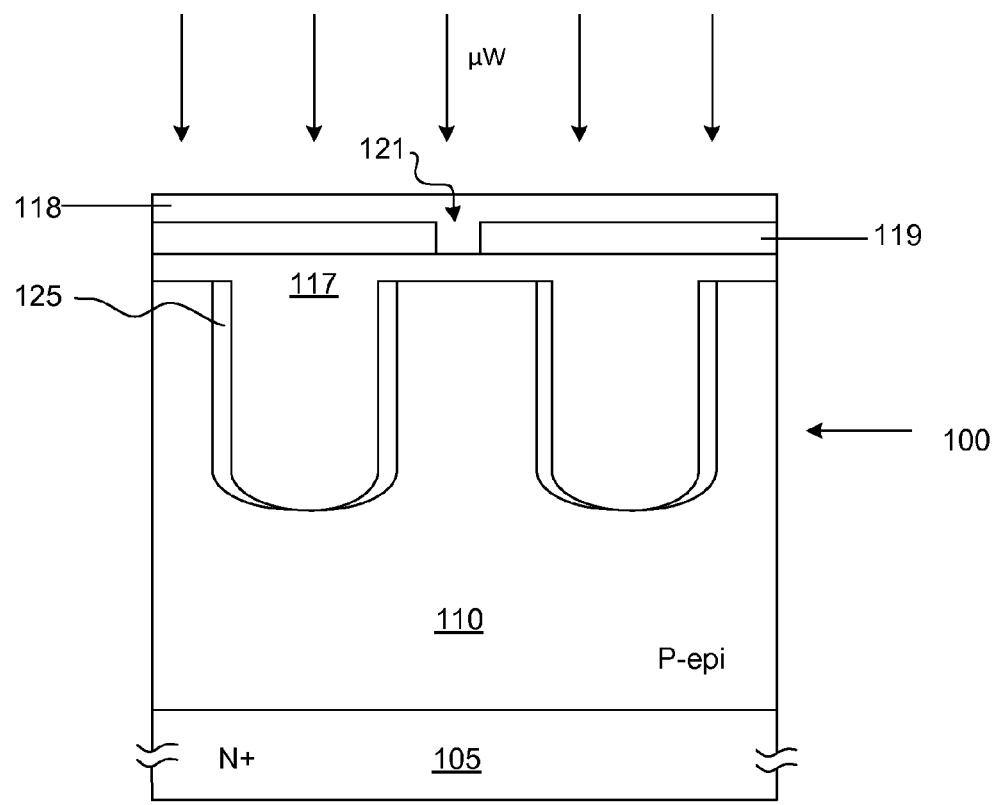

The crystalline structure of the pre-gate layer 117 can then be modified to form a material with a single crystal structure. In some embodiments, the crystalline structure can be modified by contacting the pre-gate layer 117 with a seed layer 118 of a substantially similar material having the desired single-crystal structure and with the grain size and grain orientation substantially similar to the desired, single crystal structure. In some configurations, as shown in FIG. 4A, this seed layer 118 can be formed on the pre-gate layer 117. In other configurations, as shown in FIG. 4B, a dielectric layer 119 (i.e., an oxide layer) can be formed on pre-gate layer 117. An opening 121 can be then be formed in the dielectric layer 119, thereby exposing the pre-gate layer 117. Then, as shown in FIG. 4B, the seed layer 118 can be deposited over the dielectric layer 118 so that the seed layer 118 fills in the opening 121, thereby contacting the pre-gate layer 117.

The crystalline structure of pre-gate layer 117 can then be modified by heating the structure with microwaves (MW) at low temperatures. This heating process may also include a non-MW supplemental heating system. The heating process reaches the desired temperature(s) for optimal grain growth induced by MW radiation, causing the crystals of the material in the pre-gate layer 117 to re-grow using the crystalline structure of the seed layer 118 as a seed (and to activate the dopants in pre-gate layer 117 if they are present). In some embodiments, these low temperatures can be less than about 800° C. In other embodiments, these low temperatures can range from about 200 to about 800° C. In yet other embodiments, the temperatures can range from about 200 to about 550° C. In still other embodiments, these low temperatures can be any suitable combination or sub-range of these temperatures.

The microwave activation process can use any frequency or wavelength of microwaves that are allowed for industrial applications by government regulations. In some embodiments, the frequency and wavelength of the microwaves can be any of those allowed by international regulations for industrial applications. In other embodiments, the frequency of the microwaves can range from about 2.45 GHz to about 5.8 GHz and have a wavelength ranging from about 52 mm to about 123 mm.

The microwave activation process can be performed for any time sufficient to form the epitaxial layer 110. In some embodiments, the time can range up to about 120 minutes, which is much shorter than the 5 to 6 hours that are often required in some conventional furnace processes used when forming epitaxial layers. In other embodiments, this time can range from about 1 minute to about 120 minutes. In yet other embodiments, the time can range from about 2 minutes to about 60 minutes. In still other embodiments, the time can range from about 2 minutes to about 15 minutes. In even other embodiments, the time can be any suitable combination or sub-range of these amounts.

In some embodiments, a combination of rapid thermal processing (RTP) and a MW anneal can be used to modify the crystalline structure (and optionally activate the dopants). In these embodiments, the RTP can be performed from about 900° C. to about 1100° C. for about 2 to about 15 minutes and the MW anneal process can be performed from about 200° C. to about 550° C. for about 2 to about 30 minutes.

In some embodiments, background gases may be used during the recrystallization process to prevent (or reduce) oxygen or moisture from pining the grains and preventing single crystal formation. Examples of these gases include "forming gas", i.e. $H_2/N_2$ or $H_2$, or combinations thereof. These gases can be present in any concentration sufficient to obtain these results, such as about 4% to about 100% of $H_2$ in $N_2$.

The recrystallized grain size and orientation of the single crystal structure can be selected with the desired properties in mind. In some embodiments, the single-crystal structure can have a [110] structure for optimal mobility of p-doped gates in pMOS devices. In other embodiments, the single-crystal structure can have an [100] orientation for optimal mobility in MOS devices. In one example, the pre-gate layer 117 can comprise polycrystalline Si that could be converted to single-crystal Si by attaching the poly-Si to a desired crystal face of the seed layer 118 [i.e., (111), (100), or (110) or (311)]. When the pre-gate layer 117 is re-crystallized, the desired crystal plane propagates through the material as it recrystallizes.

Once the pre-gate layer 117 has been recrystallized (or regrown) with the desired single-crystal structure, the seed layer 118 can be removed, if needed. Where the entire seed layer 118 contacts the pre-gate layer 117, the two layers grow together during the MW heating process to form a single layer and the seed layer does not need to be removed. Where the seed layer 118 contacts the pre-gate layer 117 through the opening 121 in dielectric layer 119, both the dielectric layer 119 and the seed layer 118 can be removed using any process, including polishing (i.e., CMP) or etching.

In other embodiments, the recrystallization process can be performed as an in-situ process using low temperature MW heating while the pre-gate layer 117 is formed. In these embodiments, the Si or SiGe material (or other material of the pre-gate layer 117) can be deposited as a single crystal structure since the deposited amorphous (or polycrystalline) structure regrows during deposition in the presence of MW radiation. In some configurations, this in-situ recrystallization process can be performed by a zone refining process where the deposited amorphous (or polycrystalline) material of the pre-gate layer 117 regrows as it passes thru a zone of MW radiation. A seed crystal (or layer) of the desired size and orientation is located either in the bottom of the trench or elsewhere on the Si mesa so that contact can be made to the amorphous (or polycrystalline) material being deposited in the trench 120.

Figure 5:
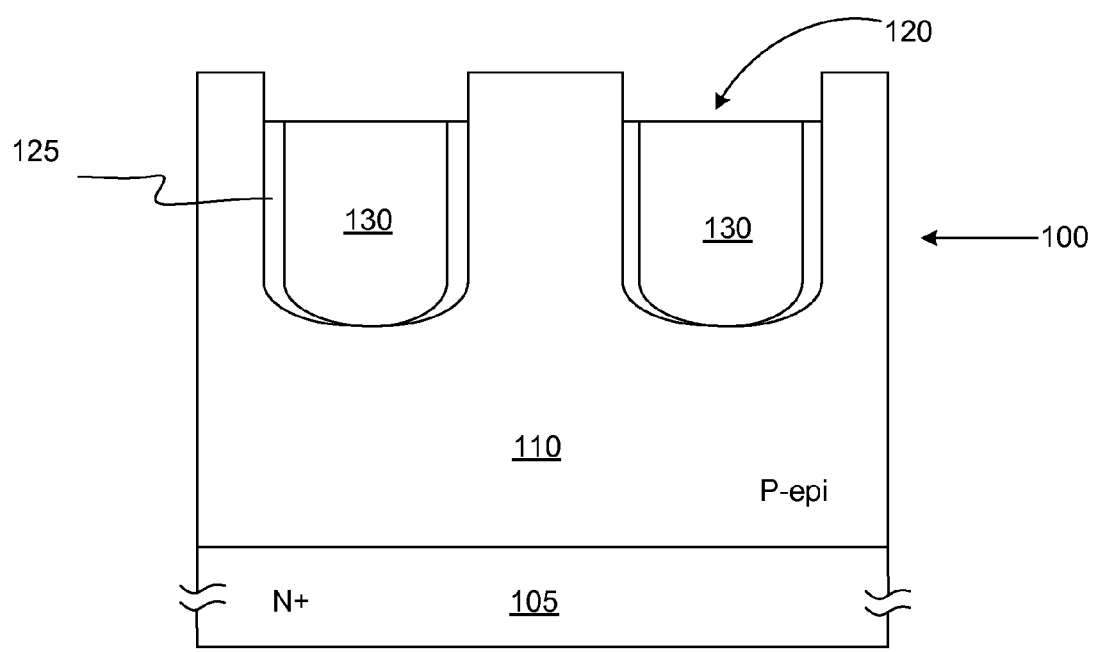
FIG. 5 shows some embodiments of methods for making a semiconductor structure containing a single-crystal gate formed on the gate insulating layer.

After the pre-gate layer 117 has been modified to comprise a substantially single crystal structure, a gate conductor 130 (or gate 130) can be formed from the single-crystal pre-gate layer 117. In some embodiments, as shown in FIG. 5, the gate conductor 130 can be formed by removing the upper portion of the single-crystal pre-gate layer 117 using any process, including an etchback process. The result of the removal process also removes the gate insulating layer 125 on the upper portion of the trench sidewall, leaving the gate 130 overlying the gate insulating layer 125 formed on the bottom of the trench 120 and sandwiched between the gate insulating layer 125 left on the lower potions of the trench sidewalls, as shown in FIG. 5.

The trench MOSFET structure can then be completed using any process known in the art. In some embodiments, a p-region 245 can be formed in an upper portion of the epitaxial layer 110, as shown in FIG. 5. The p-region can be formed using any process known in the art. In some embodiments, the p-regions regions 245 can be formed by implanting a p-type dopant in the upper surface of the epitaxial layer 110 and then driving-in the dopant using any known process.

Figure 6:
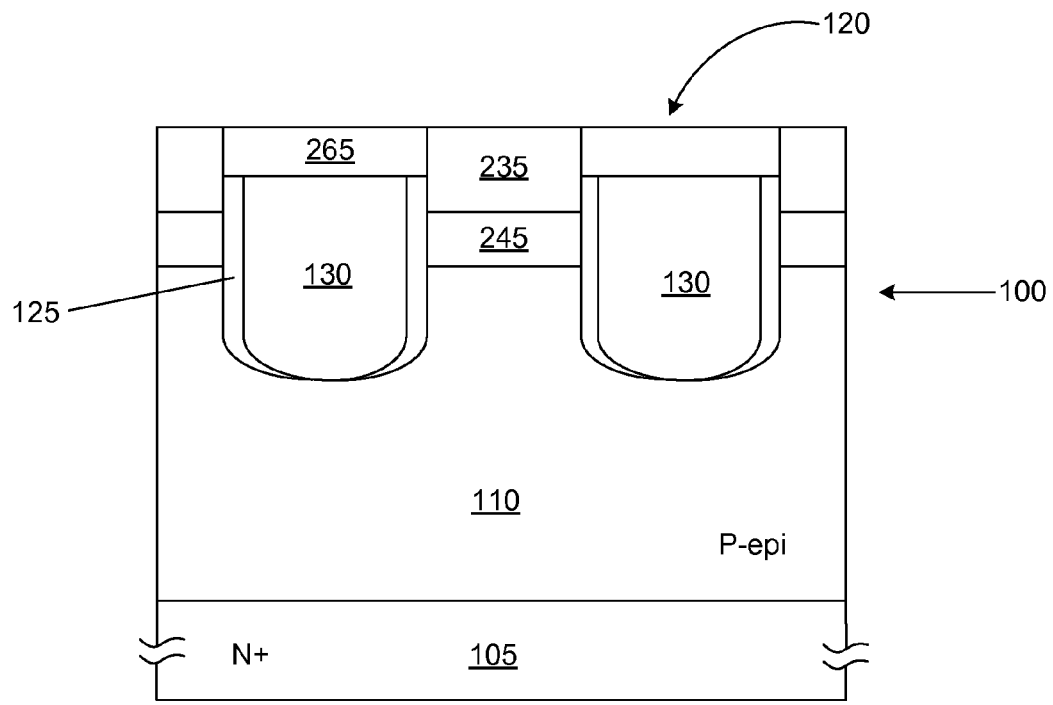
FIG. 6 shows some embodiments of methods for making a semiconductor structure containing an insulation cap on the gate.

Next, a contact region 235 can be formed on the exposed upper surface of the epitaxial layer 110. The contact region 235 can be formed using any process known in the art. In some embodiments, the contact regions 235 can be formed by implanting an n-type dopant in the upper surface of the epitaxial layer 110 and then driving-in the dopant using any known process. The resulting structures after forming the contact region 235 are illustrated in FIG. 6.

Then, the upper surface of the gate 130 is covered with an overlying insulating layer. The overlying insulating layer can be any insulating material known in the art. In some embodiments, the overlying insulating layer comprises any dielectric material containing B and/or P, including BPSG, PSG, or BSG materials. In some embodiments, the overlying insulating layer may be deposited using any CVD process until the desired thickness is obtained. Examples of the CVD processes include PECVD, APCVD, SACVD, LPCVD, HDPCVD, or combinations thereof. When BPSG, PSG, or BSG materials are used in the overlying insulating layer, they can be reflowed.

Then a portion of the overlying insulating layer is removed to leave an insulation cap 265. In the embodiments depicted in FIG. 6, the overlying insulating layer can be removed using any known mask and etching procedure that removes the material in locations other than the gate 130. Thus, an insulating cap 265 is formed over the gate 130. The excess amounts of the overlying insulating layer can be removed using any etch back or planarization process.

Figure 7:
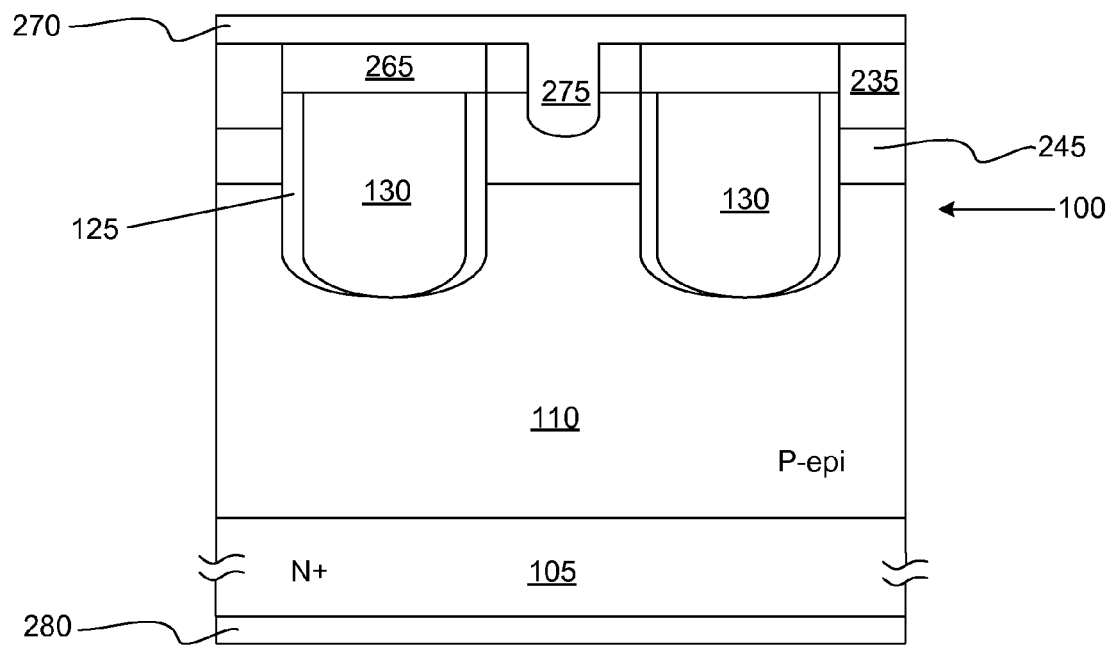
FIG. 7 shows some embodiments of methods for making a semiconductor structure containing a trench MOSFET device.

Next, as depicted in FIG. 7, the contact region 235 and the p-region 245 can be etched to form an insert region 275. The insert region 275 can be formed using any known masking and etching process until the desired depth (into the p-region 245) is reached. Next, as shown in FIG. 6, a source layer (or region) 270 can be deposited over the upper portions of the insulation cap 265 and the contact region 235. The source layer 270 can comprise any conductive and/or semiconductive material known in the art, including any metal, silicide, polysilicon, or combinations thereof. The source layer 270 can be deposited by any known deposition process, including chemical vapor deposition processes (CVD, PECVD, LPCVD) or sputtering processes using the desired metal as the sputtering target. The source layer 260 will also fill in the insert region 275.

After (or before) the source layer 270 has been formed, a drain 280 can be formed on the backside of the substrate 105 using any process known in the art. In some embodiments, the drain 280 can be formed on the backside by thinning the backside of the substrate 105 using any process known in the art, including a grinding, polishing, or etch processes. Then, a conductive layer can be deposited on the backside of the substrate 105 as known in the art until the desired thickness of the conductive layer of the drain is formed, as shown in FIG. 7.

These single-crystal gates formed from the recystallized pre-gate layer 117 (i.e., Si or SiGe gates) and the associated methods for forming them have several useful features. First, the resistance and mobility of a-Si, polysilicon, and SiGe materials that are conventionally used in a U-MOS gate are often limited by the dopant concentration, grain size, grain orientation, and the thermal budget after they have been formed. The desired crystal structure and orientation, along with dopant activation, can be achieved using microwave radiation. The optimal conditions for growing the preferred crystal orientation at the optimal rate and distance from the seed crystal can be determined by making FIB cuts of staircase structures with a faces of the appropriate orientation of Si or SiGe on to which the deposited layer is formed and regrown. These FIB structures would be put at various distances the appropriate distances from the trench to determine the conditions for optimal regrowth by the microwave radiation. These structures produced by a FIB cut are a template that can be used for generating single crystal gates without needing to grow different orientations of Si or SiGe and making contact to them via the deposited gate material. These templates can then be used to make the required single crystal seed layers of an orientation that can be propagated along a maximum distance from the gate trench structures.

Second, single crystal Si or SiGe gates also enable formation of a sharper interface between the single crystal gate and the silicide formed on the gate structure, unlike the interface between a polysilicon or a-Si or SiGe gate which is unstable during heat treatment. The growth along a single crystal provides a smoother interface that allows a thicker silicide to be formed with a boundary to the single crystal gate closer to the source and well junction of the trench MOSFET device. This configuration allows formation of a lower sheet resistance gate with lower gate resistance that has greater resistance to thermal degradation and allows formation of a higher switching speed device.

It is understood that all material types provided herein are for illustrative purposes only. Accordingly, while specific dopants are names for the n-type and p-type dopants, any other known n-type and p-type dopants (or combination of such dopants) can be used in the semiconductor devices. As well, although the devices of the invention are described with reference to a particular type of conductivity (P or N), the devices can be configured with a combination of the same type of dopant or can be configured with the opposite type of conductivity (N or P, respectively) by appropriate modifications.

Indeed, the dopant profile can be varied across the gate structure forming P/N layers on P/N; N/P; N-I-P; P-I-N; N-I-N or N-I-P configurations. In some configurations, these combinations of n, p, and/or intrinsic dopants may provide an improved charge balance by optimizing the electric field surrounding the gate when it is turned on to provide higher breakdown voltage (BVDSS) for a given epitaxial resistance. As well, these combinations of dopants may also be used in termination trenches which could be deeper than active device trenches to provide higher BVDSS than with smaller die size than with some conventionally doped trenches.

This application also relates to a UMOS semiconductor device, comprising: a semiconductor substrate containing a trench; an insulating layer in the trench; a single-crystal Si or SiGe gate layer on the insulating layer, wherein the single-crystal Si or SiGe material of the gate layer has been recrystallized from a non-single crystal structure using microwaves at low temperatures; an insulating layer over the gate layer; and a source and a drain.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, examples are meant to be illustrative only and should not be construed to be limiting in any manner.

The invention claimed is:

1. A method for making a single crystal gate structure in a semiconductor device, comprising:
   providing a semiconductor substrate;
   forming a trench in the substrate;
   forming an insulating layer in the trench;
   depositing a pre-gate layer in the trench on the insulating layer, the pre-gate layer comprising a conductive and/or semiconductive material with a non-single crystal structure;
   contacting the pre-gate layer with a seed layer with a single-crystal structure; and
   heating the pre-gate layer using microwaves at low temperatures to recrystallize the non-single crystal structure into a single-crystal structure.

2. The method of claim 1, wherein the pre-gate layer comprising amorphous Si, polysilicon, or SiGe.

3. The method of claim 1, wherein the contacting process comprises depositing the seed layer on the pre-gate layer.

4. The method of claim 1, wherein the contacting process comprises depositing a dielectric layer over the pre-gate layer, forming an opening in the dielectric layer, and then depositing the seed layer so that it substantially fills the opening.

5. The method of claim 1, wherein the heating is performed at a temperature less than about 550° C.

6. The method of claim 1, wherein the low temperature of the heating process ranges from about 200° C. to about 550° C.

7. The method of claim 1, wherein the temperature of the heating process ranges from about 400° C. to about 550° C.

8. The method of claim 1, further comprising doping the pre-gate layer with a dopant and then activating the dopant using the low temperature microwaves.

9. A method for making a UMOS semiconductor device, comprising:
   providing a semiconductor substrate;
   forming a trench in the substrate;
   forming an insulating layer in the trench;
   depositing a pre-gate layer in the trench on the insulating layer, the pre-gate layer comprising a conductive and/or semiconductive material with a non-single crystal structure;
   contacting the pre-gate layer with a seed layer with a single-crystal structure; and
   heating the pre-gate layer using microwaves at low temperatures to recrystallize the non-single crystal structure into a gate layer with a single-crystal structure;
   forming an insulating layer over the gate layer; and
   forming a source and a drain.

10. The method of claim 9, wherein the pre-gate layer comprising amorphous Si, polysilicon, or SiGe.

11. The method of claim 9, wherein the contacting process comprises depositing the seed layer on the pre-gate layer.

12. The method of claim 9, wherein the contacting process comprises depositing a dielectric layer over the pre-gate layer, forming an opening in the dielectric layer, and then depositing the seed layer so that it substantially fills the opening.

13. The method of claim 9, wherein the heating is performed at a temperature less than about 550° C.

14. The method of claim 9, wherein the low temperature of the heating process ranges from about 200° C. to about 550° C.

15. The method of claim 9, wherein the temperature of the heating process ranges from about 400° C. to about 550° C.

16. The method of claim 9, further comprising doping the pre-gate layer with a dopant and then activating the dopant using the low temperature microwaves.

17. A method for making a single crystal gate structure in a semiconductor device, comprising:
   providing a semiconductor substrate;
   forming a trench in the substrate;
   forming an insulating layer in the trench;
   providing a seed layer with a single-crystal structure on the insulating layer; and
   depositing a conductive and/or semiconductive material with a non-single crystal structure while heating using microwaves at low temperatures to recrystallize the non-single crystal structure into a single-crystal structure.

18. The method of claim 17, wherein the conductive and/or semiconductive material comprises amorphous Si, polysilicon, or SiGe.

19. The method of claim 17, wherein the heating is performed at a temperature less than about 550° C.

20. The method of claim 17, further comprising doping the conductive and/or semiconductive material with a dopant and then activating the dopant using the low temperature microwaves.

* * * * *